(12) United States Patent
Sugano

(10) Patent No.: US 7,135,893 B2
(45) Date of Patent: Nov. 14, 2006

(54) COMPARATOR CIRCUIT

(75) Inventor: Takashi Sugano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 16 days.

(21) Appl. No.: 11/085,611

(22) Filed: Mar. 22, 2005

(65) Prior Publication Data
US 2005/0218938 A1 Oct. 6, 2005

(30) Foreign Application Priority Data
Mar. 23, 2004 (JP) ............................. 2004-084919

(51) Int. Cl.
H03K 5/22 (2006.01)
(52) U.S. Cl. .............................. 327/65; 327/63; 327/50
(58) Field of Classification Search ................... 327/50, 327/62, 63, 65, 69, 70
See application file for complete search history.

(56) References Cited
U.S. PATENT DOCUMENTS
5,600,275 A * 2/1997 Garavan ..................... 327/307
5,864,587 A * 1/1999 Hunt ........................... 375/316
6,366,137 B1 * 4/2002 Garnier ......................... 327/64

FOREIGN PATENT DOCUMENTS
JP 63-082120 A 4/1988
JP 06-090125 A 3/1994
JP 2002-149626 5/2002

* cited by examiner

Primary Examiner—Dinh T. Le
(74) Attorney, Agent, or Firm—Morrison & Foerster LLP

(57) ABSTRACT

A comparator circuit that operates over a wide range of input voltage from Vss to Vdd is offered. This comparator circuit includes a first comparator receiving a pair of differential input signals from input terminals, a second comparator to which a pair of differential outputs of the first comparator is inputted, a current source that provides the pair of differential outputs of the first comparator with a very low current that flows to a ground and a third comparator that receives the pair of differential input signals from the input terminals. A differential output of the second comparator and a differential output of the third comparator are combined to make an output signal. The output signal is received by to an inverter. The first comparator is a P-type comparator while the second and the third comparators are N-type comparators.

9 Claims, 3 Drawing Sheets

COMPARATOR CIRCUIT

CROSS-REFERENCE OF THE INVENTION

This invention is based on Japanese Patent Application No. 2004-084919, the content of which is incorporated herein by reference in its entirety.

BACKGROUND OF THE INVENTION

1. Field of the Invention

This invention relates to a comparator circuit that compares a pair of differential input signals.

2. Description of the Related Art

It is a common practice in recent years to transmit high frequency signals in a form of differential signals in order to suppress an influence of noise or the like. A comparator is generally used as an interface when an LSI receives such differential signals. When a USB cable is connected to a microcomputer, for example, the microcomputer is provided with an interface having a comparator as disclosed in Japanese Patent Publication No. 2002-149626.

FIGS. 4A and 4B are circuit diagrams showing a comparator according to a prior art. The comparator is composed of a pair of N-channel type differential MOS transistors MN1 and MN2, a pair of P-channel type MOS transistors MP1 and MP2 connected in a form of a current mirror and a constant current source 1, as shown in FIG. 4A. A gate of the differential MOS transistor MN1 makes a positive input terminal 2, a gate of the differential MOS transistor MN2 makes a negative input terminal 3, a connecting node between MP2 and MN2 makes a positive output terminal 4, and a connecting node between MP1 and MN1 makes a negative output terminal 5. The circuit expressed in a circuit symbol is shown in FIG. 4B. The comparator described above is hereafter referred to as "an N-type comparator" for the sake of convenience.

Since this circuit uses the pair of N-channel type differential MOS transistors MN1 and MN2 as differential transistors, when a differential input voltage Vin is close to Vss, more specifically when Vin<Vtn+α, a source-drain impedance of each of the differential MOS transistors MN1 and MN2 becomes so high that the circuit operates only at reduced rate or halts the operation. Here, Vtn is a threshold voltage of each of the pair of N-channel type differential MOS transistors MN1 and MN2 and α stands for a change in the threshold voltage Vtn due to a back-gate bias effect. Therefore, the input voltage to the comparator is limited within a range from Vtn+α to Vdd.

FIGS. 5A and 5B are circuit diagrams showing another comparator according to a prior art.

This comparator is composed of a pair of P-channel type differential MOS transistors MP11 and MP12, a pair of N-channel type MOS transistors MN11 and MN12 connected in a form of a current mirror and a constant current source 10, as shown in FIG. 5A. A gate of the differential MOS transistor MP11 makes a positive input terminal 12, a gate of the differential MOS transistor MP12 makes a negative input terminal 13, a connecting node between MP12 and MN12 makes a positive output terminal 14, and a connecting node between MP11 and MN11 makes a negative output terminal 15. The circuit expressed in a circuit symbol is shown in FIG. 5B. The comparator described above is hereafter referred to as "a P-type comparator" for the sake of convenience.

Since this circuit uses the pair of P-channel type differential MOS transistors MP11 and MP12 as differential transistors, when a differential input voltage Vin is close to Vdd, more specifically when Vin>Vdd−Vtp−β, a source-drain impedance of each of the differential MOS transistors MP11 and MP12 becomes so high that the circuit operates only at reduced rate or halts the operation. Here, Vtp is a threshold voltage of each of the pair of P-channel type differential MOS transistors MP11 and MP12 and β stands for a change in the threshold voltage Vtp due to a back-gate bias effect. Therefore, the input voltage to the comparator is limited within a range from Vss to Vtp+β.

Normal operation of the comparator described above is guaranteed only for the input voltage within the range from Vtn+α to Vdd or the range from Vss to Vdd−Vtp−β. Therefore, the comparators do not meet a device design requiring a wide input voltage ranging from Vss to Vdd.

SUMMARY OF THE INVENTION

A comparator circuit of this invention includes a first comparator having a pair of differential transistors of a first conductivity type that receives a pair of differential input signals, a second comparator having a pair of differential transistors of a second conductivity type to which a pair of differential outputs of the first comparator is inputted, a current source connected to the pair of differential outputs of the first comparator and a third comparator having a pair of differential transistors of the second conductivity type. An output signal of the comparator circuit is obtained by combining a differential output of the second comparator and a differential output of the third comparator.

DETAILED DESCRIPTION OF THE INVENTION

Figure 1:
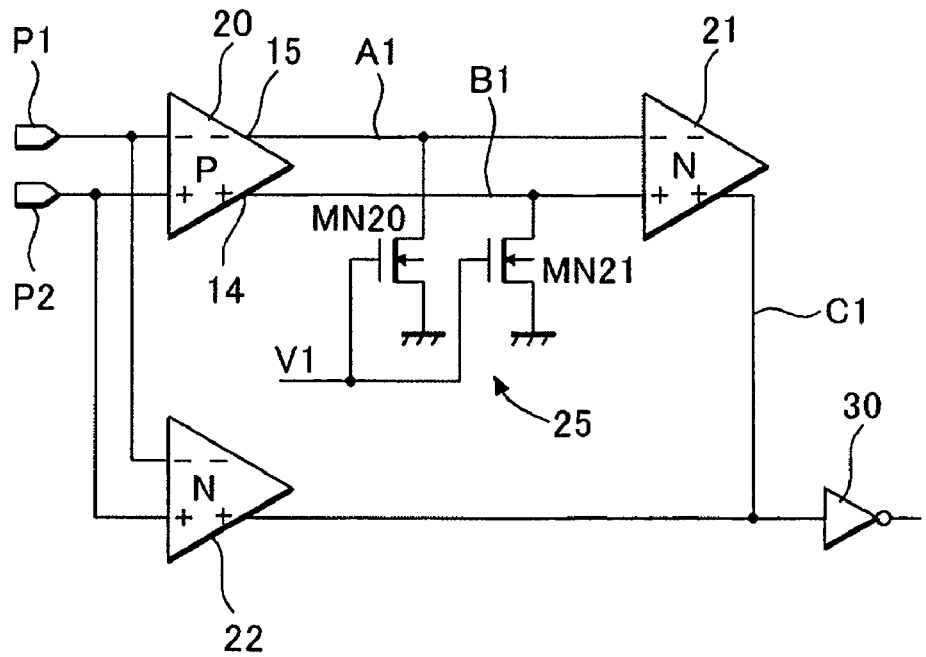
FIG. 1 is a circuit diagram of a comparator circuit according to a first embodiment of this invention.

Next, a comparator circuit according to a first embodiment of this invention will be explained referring to the figures. FIG. 1 is a circuit diagram of the comparator circuit.

This comparator circuit includes a first comparator 20 receiving a pair of differential input signals from input terminals P1 and P2, a second comparator 21 to which a pair of differential outputs of the first comparator 20 is inputted, a current source 25 that provides the pair of differential outputs with a very low current flowing to a ground, and a third comparator 22 that receives the pair of differential input signals from the input terminals P1 and P2. A differential output of the second comparator 21 and a differential output of the third comparator 22 are combined to make an output signal. The output signals are inputted to an inverter 30.

Figure 4A:
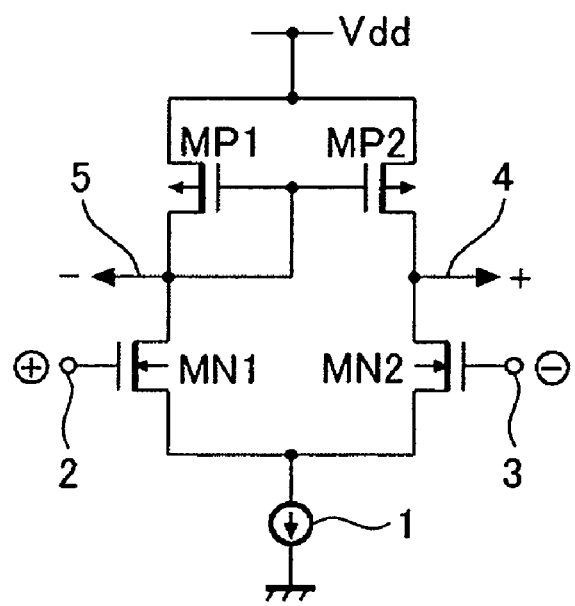
FIG. 4 is a circuit diagram of a comparator according to a conventional art.
Figure 4B:
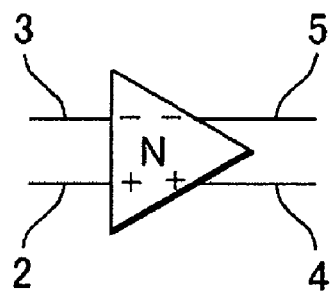
Figure 5A:
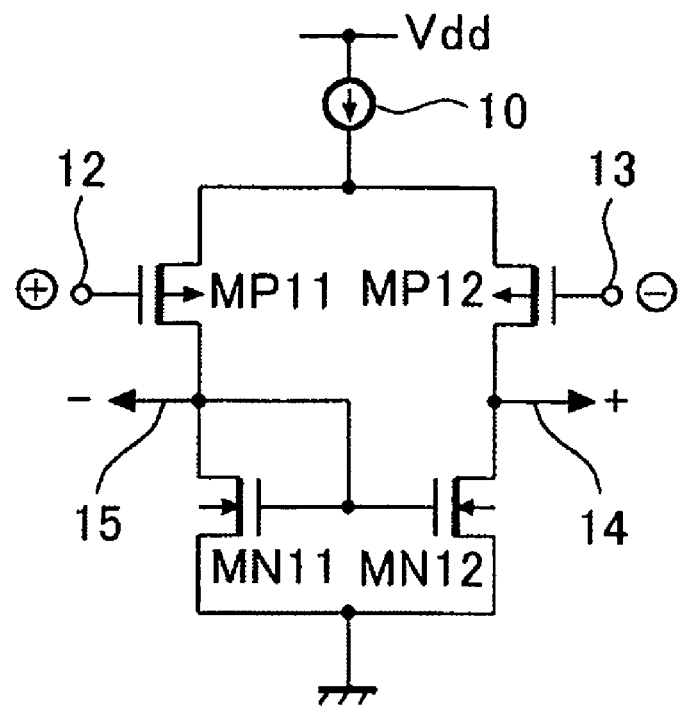
FIG. 5 is a circuit diagram of another comparator according to a conventional art.
Figure 5B:
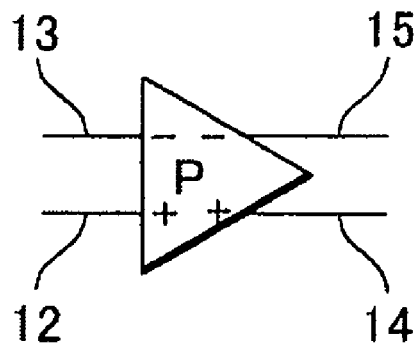

The first comparator 20 is the same P-type comparator as shown in FIGS. 5A and 5B, while the second and the third comparators are the same N-type comparators as shown in FIGS. 4A and 4B. And the current source 25 is made of N-channel type MOS transistors MN20 and MN21. A drain of the N-channel type MOS transistor MN20 is connected to a wiring A1 that is connected to a negative output terminal 15 of the first comparator 20, while a ground voltage Vss is applied to its source and a gate voltage V1 is applied to its gate. Also a drain of the N-channel type MOS transistor MN21 is connected to a wiring B1 that is connected to a positive output terminal 14 of the first comparator 20, while the ground voltage Vss is applied to its source and the gate voltage V1 is applied to its gate. The gate voltage V1 is set to a voltage close to a threshold voltage of each of the N-channel type MOS transistors MN20 and MN21 so that the very low current, that is, for example, less than 10% of a total current drawn by the comparator circuit, flows through each of them.

Next, operation of the comparator circuit described above will be explained. When a voltage Vin of each of the differential input signals is close to the power supply voltage Vdd, more specifically when Vin>Vdd−Vtp−β, the differential outputs of the first comparator are of high impedance, and the very low current provided by the current source 25 reduces a voltage of each of the differential outputs to the ground voltage Vss. In other words, the differential outputs of the first comparator 20 are biased to the ground voltage Vss.

Then, the differential outputs of the second comparator, that is the N-type comparator, become to be of high impedance, since the pair of differential inputs to the second comparator 21 is at the ground voltage Vss. An output C1 is taken out from the positive output terminal of the second comparator 21 and is applied to the inverter 30 in this circuit. The output C1 is of high impedance. On the other hand, the third comparator 22 operates normally even when the voltage Vin of the pair of differential input signals from the input terminals P1 and P2 is close to the power supply voltage Vdd, since the third comparator 22 is the N-type comparator. Therefore, the output signal is obtained from the third comparator 22 when the voltage Vin of the pair of differential input signals from the input terminals P1 and P2 is close to the power supply voltage Vdd, more specifically when Vin>Vdd−Vtp−β.

When the voltage Vin of the pair of differential input signal from the input terminals P1 and P2 is close to the ground voltage Vss, more specifically when Vin<Vtn+α, on the other hand, the differential outputs of the third comparator 22 become to be of high impedance. The first comparator 20 operates normally in this case, and the output signal at either a low level (the ground voltage Vss) or a high level (the power supply voltage Vdd) is obtained from the differential outputs of the first comparator 20. The current provided by the current source 25 is so low that it has practically no influence over the operation of the first comparator 20.

Receiving the differential outputs of the first comparator 20, the second comparator 21 also operates normally. That is, the resulting output signal is obtained from the second comparator 21. When the voltage Vin of the pair of differential input signals from the input terminals P1 and P2 is out of the range described above (that is, when Vin is in a middle range between the power supply voltage Vdd and the ground voltage Vss), both the second comparator 21 and the third comparator 22 simultaneously output the output signals which are inputted to the inverter 30. However, receiving both of the output signals with the inverter 30 causes no problem of malfunctioning, since both the second comparator 21 and the third comparator 22 are the N-type comparators, thus their outputs are similar to each other, and their dependence on the power supply voltage and the like can be adjusted.

Figure 2:
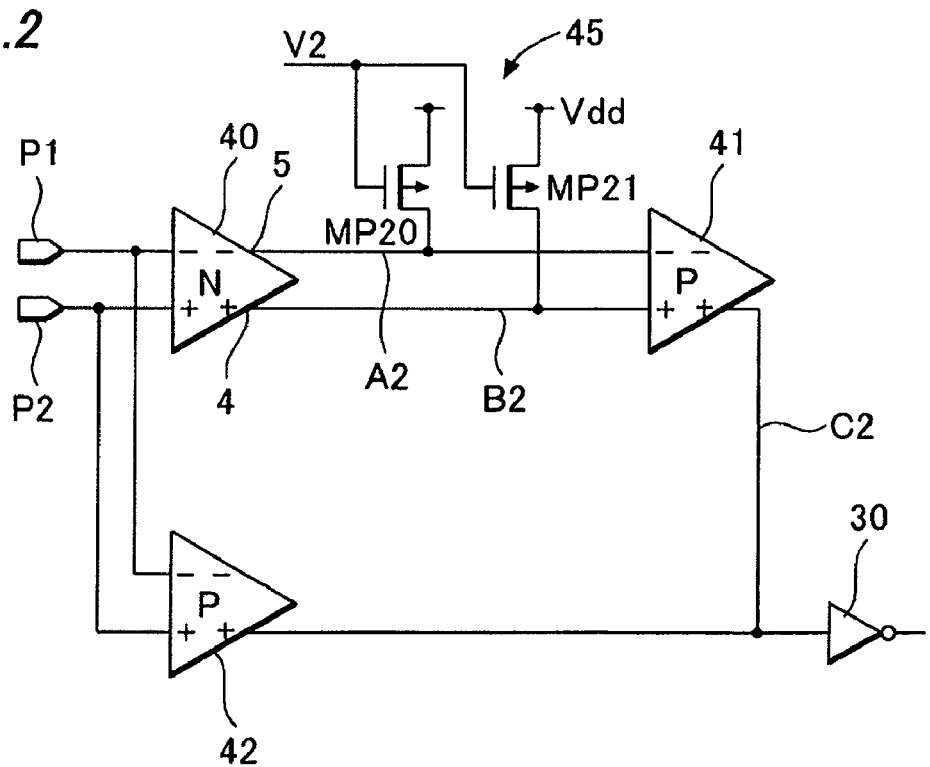
FIG. 2 is a circuit diagram of a comparator circuit according to a second embodiment of this invention.

Next, a comparator circuit according to a second embodiment of this invention will be explained referring to the figures. FIG. 2 is a circuit diagram of the comparator circuit. This comparator circuit is a reverse of the comparator circuit of the first embodiment in terms of polarity, and includes a first comparator 40 receiving a pair of differential input signals from input terminals P1 and P2, a second comparator 41 to which a pair of differential outputs of the first comparator 40 is inputted, a current source 45 that provides the pair of differential outputs with a very low current flowing to the power supply and a third comparator 42 receiving the pair of differential input signals from the input terminals P1 and P2. A differential output of the second comparator 41 and a differential output of the third comparator 42 are combined to make an output signal. The output signal is inputted to an inverter 30.

The first comparator 40 is the same N-type comparator as shown in FIGS. 4A and 4B, while the second and the third comparators 41 and 42 are the same P-type comparators as shown in FIGS. 5A and 5B. And the current source 45 is made of P-channel type MOS transistors MP20 and MP21. A drain of the P-channel type MOS transistor MP20 is connected to a wiring A2 that is connected to a negative output terminal 5 of the first comparator 20, while the power supply voltage Vdd is applied to its source and a gate voltage V2 is applied to its gate. Also a drain of the P-channel type MOS transistor MP21 is connected to a wiring B2 that is connected to a positive output terminal 4 of the first comparator 40, while the power supply voltage Vdd is applied to its source and the gate voltage V2 is applied to its gate. The gate voltage V2 is set to a voltage close to a threshold voltage of each of the P-channel type MOS transistors MP20 and MP21 so that the very low current, that is, for example, less than 10% of a total current drawn by the comparator circuit, flows through each of them.

Next, operation of the comparator circuit described above will be explained. When a voltage Vin of each of the pair of differential input signals is close to the ground voltage Vss, more specifically when Vin<Vtn+α, the differential outputs of the first comparator 40 are of high impedance, and the very low current provided by the current source 45 turns a voltage of each of the differential outputs to the power supply voltage Vdd. In other words, the differential outputs of the first comparator 40 are biased to the power supply voltage Vdd.

Then, the differential outputs of the second comparator 41, that is the P-type comparator, become to be of high impedance, since the pair of differential inputs to the second comparator 41 is at the power supply voltage Vdd. An output C2 is taken out from the positive output terminal of the second comparator 41 and is applied to the inverter 30 in this circuit. The output C2 is made to be of high impedance. On the other hand, the third comparator 42 operates normally even when the voltage Vin of the pair of differential input signals from the input terminals P1 and P2 is close to the ground voltage Vss, since the third comparator 42 is the P-type comparator. Therefore, the output signal is obtained from the third comparator 42 when the voltage Vin of the pair of differential input signals from the input terminals P1 and P2 is close to the ground voltage Vss, more specifically when Vin>Vtn+α.

When the voltage Vin of the pair of differential input signals from the input terminals P1 and P2 is close to the power supply voltage Vdd, more specifically when Vin>Vdd−Vtp−α, on the other hand, the differential outputs of the third comparator 42 are of high impedance. The first comparator 40 operates normally in this case, and the output signal at either a low level (the ground voltage Vss) or a high level (the power supply voltage Vdd) is obtained from the differential outputs of the first comparator 40. The current provided by the current source 45 is so low that it has practically no influence over the operation of the first comparator 40.

Receiving the differential outputs of the first comparator 40, the second comparator 41 also operates normally. That is, the resulting output signal is obtained from the second comparator 41. When the voltage Vin of the pair of differential input signals from the input terminals P1 and P2 is out of the range described above (that is, when Vin is in a middle range between the power supply voltage Vdd and the ground voltage Vss), both the second comparator 41 and the third comparator 42 simultaneously output the output signals, and the outputs are inputted to the inverter 30. However, receiving both of the output signals causes no problem of malfunctioning for the inverter 30, since both the second comparator 41 and the third comparator 42 are the P-type comparators, thus their outputs are similar to each other, and their dependence on the power supply voltage and the like is adjustable.

As described above, the comparator circuits according to the first and the second embodiments operate normally over the wide input voltage range from Vss to Vdd. In addition, since each of the comparator circuits can be basically composed of three comparators and a current source, it requires less number of elements compared with a rail-to-rail operational amplifier as well as making faster operation available.

Figure 3:
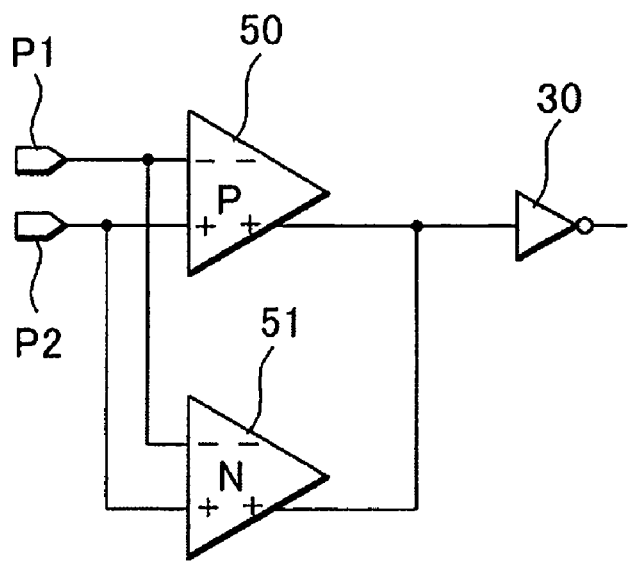
FIG. 3 is a circuit diagram of a comparator circuit for comparison with the first and the second embodiments of this invention.

Next, a comparator circuit for comparison with the first and the second embodiments of this invention will be explained referring to FIG. 3. This comparator circuit is made by simply connecting a P-type comparator 50 and an N-type comparator 51 in parallel. An output signal of the P-type comparator 50 and an output signal of the N-type comparator 51 are received by an inverter 30. However, there is a difficulty in setting a threshold value of the inverter 30 to judge high and low level correctly based on each of the output signals of the comparators, because the power supply voltage dependence of the output signal of the P-type comparator 50 differs from that of the output signal of the N-type comparator 5 1. On the other hand, setting the threshold value of the inverter 30 is easier for the comparator circuits according to the first and the second embodiments, since the output of the P-type comparator 50 and the output of the N-type comparator 51 are not mixed.

The comparator circuit that operates over the wide range of input voltage from Vss to Vdd is made available according to this invention. In addition, the comparator circuit requires less number of elements and is possible to operate faster than the rail-to-rail operational amplifier.

What is claimed is:

1. A comparator circuit comprising:
   a first comparator comprising a pair of differential transistors of a first conductivity type that receives a pair of differential input signals;
   a second comparator comprising a pair of differential transistors of a second conductivity type to which a pair of differential outputs of the first comparator is inputted;
   a current source connected to the pair of differential outputs of the first comparator; and
   a third comparator comprising a pair of differential transistors of the second conductivity type that receives the pair of differential input signals,
   wherein a differential output of the second comparator and a differential output of the third comparator are combined to provide an output signal of the comparator circuit.

2. The comparator circuit of claim 1, wherein the pair of differential transistors of the first conductivity type in the first comparator are P-channel type MOS transistors, and the pair of differential transistors of the second conductivity type in the second comparator and the pair of differential transistors of the second conductivity type in the third comparator are N-channel type MOS transistors.

3. The comparator circuit of claim 2, wherein the current source adds to the pair of differential outputs of the first comparator a substantially low current that flows to a ground.

4. The comparator circuit of claim 3, wherein the substantially low current is less than 10% of a total current drawn by the comparator circuit.

5. The comparator circuit of claim 3, wherein the current source comprises a pair of N-channel type MOS transistors.

6. The comparator circuit of claim 1, wherein the pair of differential transistors of the first conductivity type in the first comparator are N-channel type MOS transistors, and the pair of differential transistors of the second conductivity type in the second comparator and the pair of differential transistors of the second conductivity type in the third comparator are P-channel type MOS transistors.

7. The comparator circuit of claim 6, wherein the current source adds to the pair of differential outputs of the first comparator a substantially low current from a power supply.

8. The comparator circuit of claim 7, wherein the substantially low current is less than 10% of a total current drawn by the comparator circuit.

9. The comparator circuit of claim 6, wherein the current source comprises a pair of P-channel type MOS transistors.

* * * * *